US012497687B2

(12) United States Patent
Colvin et al.

(10) Patent No.: US 12,497,687 B2
(45) Date of Patent: Dec. 16, 2025

(54) ION IMPLANTATION SYSTEM AND METHOD FOR IMPLANTING ALUMINUM USING NON-FLUORINE-CONTAINING HALIDE SPECIES OR MOLECULES

(71) Applicant: Axcelis Technologies, Inc., Beverly, MA (US)

(72) Inventors: Neil Colvin, Merrimack, NH (US); David Sporleder, Billerica, MA (US); Udo H. Verkerk, Toronto (CA); Atul Gupta, Lexington, MA (US); Edward Moore, Newmarket, NH (US)

(73) Assignee: Axcelis Technologies, Inc., Beverly, MA (US)

( * ) Notice: Subject to any disclaimer, the term of this patent is extended or adjusted under 35 U.S.C. 154(b) by 38 days.

(21) Appl. No.: 18/361,024

(22) Filed: Jul. 28, 2023

(65) Prior Publication Data

US 2024/0035148 A1 Feb. 1, 2024

Related U.S. Application Data

(60) Provisional application No. 63/393,361, filed on Jul. 29, 2022.

(51) Int. Cl.

*C23C 14/48* (2006.01)
*C23C 14/14* (2006.01)
*H01J 37/317* (2006.01)

(52) U.S. Cl.

CPC .............. *C23C 14/48* (2013.01); *C23C 14/14* (2013.01); *H01J 37/3171* (2013.01)

(58) Field of Classification Search

CPC ....... C23C 14/14; C23C 14/48; H01J 37/3171
See application file for complete search history.

(56) References Cited

U.S. PATENT DOCUMENTS 6,998,626 B1 * 2/2006 Ryding .................... H01J 37/08 315/111.81
8,253,114 B2 * 8/2012 Yamashita .............. H01J 27/14 250/492.2

(Continued)

FOREIGN PATENT DOCUMENTS

WO 2019217953 A1 11/2019
WO 2022094381 A1 5/2022

OTHER PUBLICATIONS

International Search Report dated Nov. 8, 2023, in connection with PCT/US2023/029096.

*Primary Examiner* — Michael P Wieczorek
(74) *Attorney, Agent, or Firm* — Eschweiler & Potashnik, LLC

(57) ABSTRACT

An ion implantation system, ion source, and method are provided for forming an aluminum ion beam from an aluminum-containing species to an ion source. One or more of a halide species and a halide molecule are introduced to the ion source, where the halide species is selected from a group consisting of atomic chlorine, atomic bromine, and atomic iodine, and the halide molecule comprises a halide selected from a group consisting of chlorine, bromine, and iodine. The one or more of the halide species and the halide molecule clean one or more components of the ion source and further react with the aluminum-containing species to generate an aluminum-halide vapor. The aluminum ion beam is further formed from at least the aluminum-halide vapor.

16 Claims, 2 Drawing Sheets

(56) References Cited

U.S. PATENT DOCUMENTS

| | | | |
|---|---|---|---|
| 11,062,873 | B2 | 7/2021 | Colvin et al. |
| 11,699,565 | B2 | 7/2023 | Colvin et al. |
| 12,112,915 | B2 * | 10/2024 | Hahto ..................... H01J 37/08 |
| 2010/0154835 | A1 | 6/2010 | Dimeo et al. |
| 2014/0357069 | A1 | 12/2014 | Sinha et al. |
| 2019/0348252 | A1 * | 11/2019 | Colvin ................ H01J 37/3171 |
| 2022/0139664 | A1 | 5/2022 | Colvin et al. |
| 2023/0326702 | A1 | 10/2023 | Hahto et al. |

* cited by examiner

ION IMPLANTATION SYSTEM AND METHOD FOR IMPLANTING ALUMINUM USING NON-FLUORINE-CONTAINING HALIDE SPECIES OR MOLECULES

REFERENCE TO RELATED APPLICATIONS

This application claims the benefit of U.S. Provisional Application Ser. No. 63/393,361 filed Jul. 29, 2022, entitled, "ION IMPLANTATION SYSTEM AND METHOD FOR IMPLANTING ALUMINUM USING NON-FLUORINE-CONTAINING HALIDE SPECIES OR MOLECULES", the contents of which are herein incorporated by reference in their entirety.

FIELD

The present invention relates generally to ion implantation systems, and more specifically to an ion implantation system configured to generate aluminum ions from atomic aluminum and aluminum-containing materials using halide-containing species or molecules not comprising fluorine for implantation of the aluminum ions into a workpiece.

BACKGROUND

There is increasing demand for ion implants using metal ions. For example, aluminum implants are important for the power device market, which is a small but fast-growing segment of the market. For many metals, including aluminum, supplying feed material to the ion source is problematic. Systems have been previously provided that utilize a vaporizer, which is a small oven that is external to the arc chamber of the ion source, whereby metal salts are heated to produce adequate vapor pressure to supply vapor to the ion source. The oven, however, is remote from the arc chamber and takes time to heat up to the desired temperature, establish the vapor flow, start the plasma, start the ion beam, etc. Further, if a change from one metal species to some other species is desired, time is taken in waiting for the oven to cool down adequately for such a change in species.

Another conventional technique is to place a metal-containing material such as aluminum or another metal inside the arc chamber. For aluminum, the metal-containing material may comprise aluminum oxide, aluminum fluoride, or aluminum nitride, all of which can withstand the approximately 800 C temperatures of the plasma chamber. In such a system, ions are sputtered directly off the material in the plasma. Another technique is to use a plasma containing an etchant such as fluorine to attain chemical etching of the metal. While acceptable beam currents can be attained using these various techniques, compounds of aluminum oxide, aluminum chloride, and aluminum nitride, all of which are good electrical insulators, tend to be deposited on electrodes adjacent to the ion source in a relatively short period of time (e.g., 5-10 hours). As such, various deleterious effects are seen, such as high voltage instabilities and associated variations in dosage of ions being implanted.

SUMMARY

The present disclosure thus provides a system and apparatus for generating an ion beam comprising aluminum ions from atomic aluminum and/or aluminum-containing materials using halide-containing species or molecules not comprising fluorine for implantation of the aluminum ions into a workpiece. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with one aspect of the disclosure, an ion implantation system is provided for implanting aluminum ions. The ion implantation system, for example, comprises an ion source having an arc chamber and an electrode associated therewith. In one example, an ion source material is provided, wherein the ion source material comprises an aluminum-containing species.

The ion implantation system, for example, further comprises a halide source comprising one or more of a halide species and a halide molecule. The halide source, for example, is configured to provide the one or more of the halide species and the halide molecule to the ion source. Further, a heat source can be provided and configured to react the one or more of the halide species and the halide molecule with the aluminum-containing species to generate an aluminum-halide vapor for forming an ion beam, and wherein the ion source is generally etched and/or cleaned by the one or more of the halide species and the halide molecule.

In one example, the halide species is selected from a group consisting of atomic chlorine, atomic bromine, and atomic iodine, and the halide molecule comprises a halide selected from a group consisting of chlorine, bromine, and iodine. The halide molecule, for example, can comprise one or more of $Cl_2$, $CCl_4$, $BCl_3$, $Br_2$, $I_2$, HCl, HBr, HI, $CHCl_3$, $CBr_4$, ChBr3, $CH_xI_y$. In another example, the aluminum-containing species comprises one or more of atomic aluminum, AlN, $Al_2O_3$, and $Al_4C_3$.

In another example, the electrode comprises one or more of a cathode, a repeller, and an extraction electrode, and wherein the electrode is generally cleaned by the one or more of the halide species and the halide molecule. The arc chamber, for example, can further comprise one or more sidewalls, and wherein the one or more sidewalls are generally cleaned by the one or more of the halide species and the halide molecule.

The present disclosure, for example, further provides a conduit fluidly coupling the halide source to the ion source, wherein the one or more of the halide species and the halide molecule are introduced as a gas in a vicinity of the ion source. For example, a gas ring can be further provided, wherein the gas ring generally surrounds at least a portion of the ion source, and wherein the conduit is fluidly coupled to the gas ring.

In another example, the heat source comprises one or more of a plasma formed within the arc chamber and an auxiliary heat source. The auxiliary heat source, for example, can comprise one or more resistive heaters.

In yet another aspect of the disclosure, a method for forming an aluminum ion beam is provided, wherein the method comprises providing an aluminum-containing species to an ion source. One or more of a halide species and a halide molecule, for example, are introduced to the ion source, wherein the halide species is selected from a group consisting of atomic chlorine, atomic bromine, and atomic iodine, and the halide molecule comprises a halide selected from a group consisting of chlorine, bromine, and iodine. Further, an aluminum ion beam is generated from the aluminum-containing species, wherein the one or more of the halide species and the halide molecule further react with the aluminum-containing species to generate an aluminum-halide vapor, and wherein the ion source is generally cleaned by the one or more of the halide species and the halide molecule. The generation of the aluminum-halide vapor, for example, generally etches and/or cleans the ion source. Further, the method comprises forming the aluminum ion beam from at least the aluminum-halide vapor. The aluminum ion beam, for example, can be further formed from the one or more of the aluminum-containing species and/or the one or more aluminum-containing components.

In one example, the halide molecule comprises one or more of $Cl_2$, $CCl_4$, $BCl_3$, $Br_2$, $I_2$, HCl, HBr, HI, $CHCl_3$, $CBr_4$, $ChBr_3$, $CH_xI_y$. In another example, the one or more aluminum-containing species comprise one or more of atomic aluminum, AlN, $Al_2O_3$, and $Al_4C_3$. The one or more aluminum-containing components, for example, comprise one or more arc chamber components positioned within an arc chamber of the ion source.

In one example, the one or more of the halide species and the halide molecule is introduced as a gas in a vicinity of the one or more arc chamber components, such as in the vicinity of one or more of a cathode shield, an electrode, a repeller, a liner, a sidewall associated with the arc chamber, and a sidewall component operably coupled to the sidewall.

In accordance with one method, the one or more arc chamber components, for example, can be heated concurrent with the generation of the aluminum ion beam. For example, the one or more arc chamber components are heated by the generation of the aluminum ion beam and/or by an auxiliary heat source. The auxiliary heat source, for example, can comprise one or more resistive heaters.

In another example, the ion source comprises an arc chamber generally enclosed by an ion source housing, and wherein the method comprises introducing the one or more of the halide species and the halide molecule as a gas within the ion source housing. The one or more of the halide species and the halide molecule, for example, can be introduced to the ion source via a gas ring generally surrounding the arc chamber.

In another example, the ion source comprises an extraction electrode disposed within the ion source housing, wherein the method comprises cleaning a surface of the extraction electrode via the one or more of the halide species and the halide molecule.

In yet another example, the aluminum-containing species comprises gaseous dimethylaluminum chloride (DMAC) or trimethylaluminum (TMA). In one example, method further comprises mixing the gaseous DMAC or TMA with the halide species in a common gas channel prior to being provided to an ion source housing or an arc chamber plasma cavity of the ion source.

In still another example, the method comprises heating one or more of the aluminum-containing species and/or the one or more aluminum-containing components or providing the aluminum-containing species and/or the one or more aluminum-containing components at room temperature external to the ion source. As such, the one or more of the halide species and the halide molecule can be introduced to an arc chamber of the ion source after passing over the one or more of an aluminum-containing species and/or one or more aluminum-containing components, thereby defining the aluminum-halide vapor.

To the accomplishment of the foregoing and related ends, the disclosure comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
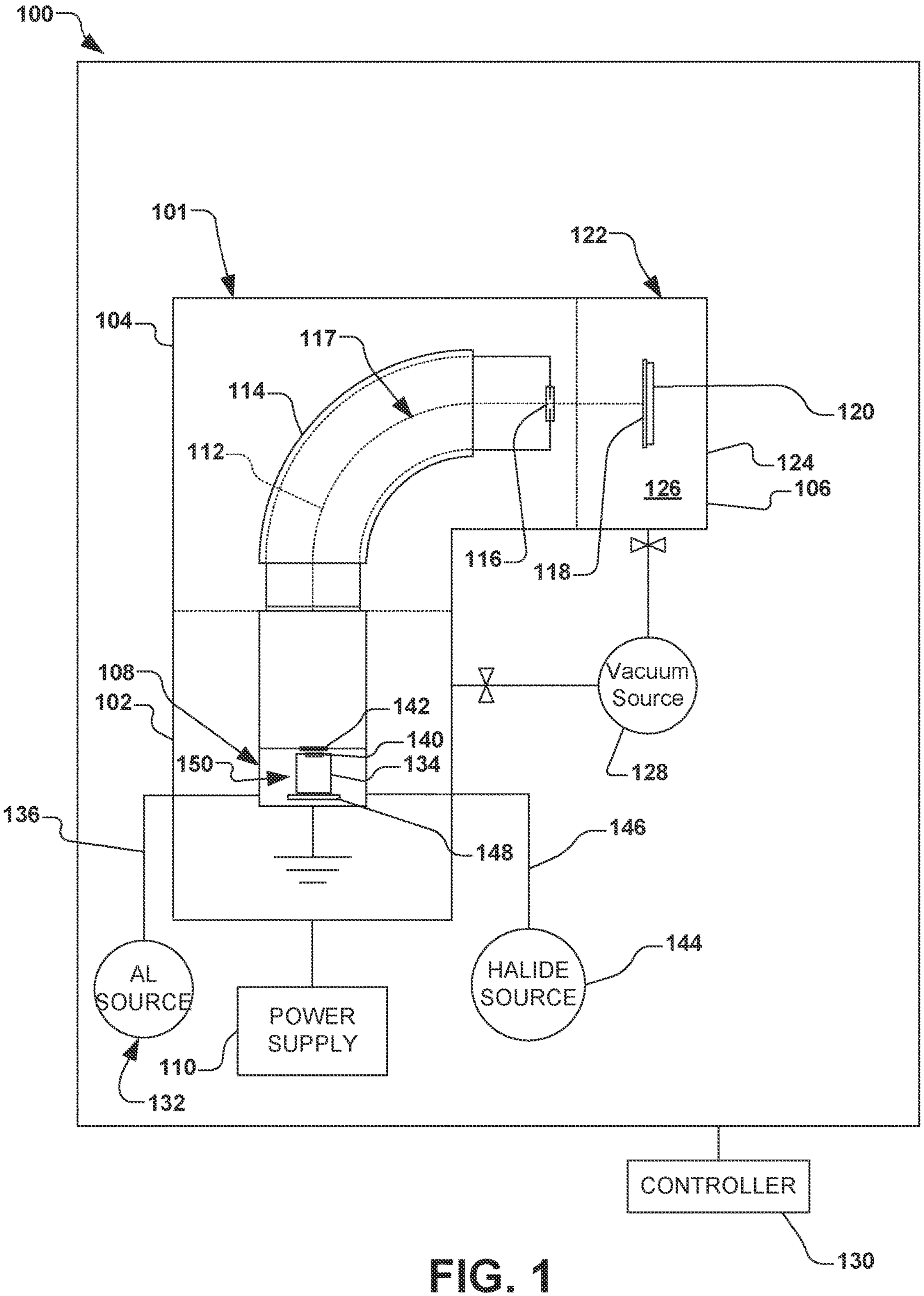
FIG. 1 is a block diagram of an exemplary vacuum system utilizing an aluminum-containing ion source material and a non-fluorine halide species in accordance with several aspects of the present disclosure.

Aluminum is being increasingly used as an alternative to boron as a dopant in ion implantation for silicon carbide (SiC) power devices. Few aluminum-containing gases exist, however, and use of such gases often lead to problems associated with decomposition at the high temperature environment of an ion source. Materials such as $AlI_3$ or $AlCl_3$ can be alternatively provided to the ion source in a solid form and vaporized via a vaporizer, however, the use of such materials in conventional systems can have problems associated with long thermal transition times and material handling. In another alternative, solids containing aluminum, such as AlN and $Al_2O_3$ can be provided as a sputter source or target within the ion source.

Additionally, atomic aluminum can be placed inside or otherwise introduced into the ion source for sputtering of aluminum ions therefrom. Such ion sources implementing a sputter source, for example, are presently provided with fluorine-containing gases to chemically-enhance the removal of aluminum material from the target. Generally, operation of such an ion source with fluorine-containing gases results in unstable operation of the ion source, including frequent high voltage instabilities between the sputter source and a suppression electrode. It is believed that such instability is a result of a deposition of aluminum fluoride material on the suppression electrode. Such deposited materials, for example, are electrically insulating and have a low vapor pressure at temperatures typical for operation of the suppression electrode.

As a result, poor performance is experienced by the conventional ion source due, at least in part, to excessive glitching of the ion source as the deposited materials increase in thickness, thus resulting in electric field breakdown due to the accumulation of charge on these insulative coatings, and leading to eventual failure of the ion source. This failure mode is typically addressed by physical cleaning and/or replacement of the coated electrodes in a preventive maintenance (PM) scheme. However, such an approach of cleaning or replacement is typically undesirable due to added downtime to conduct such PM schemes, thus deleteriously impacting productivity of the implanter.

Therefore, the present disclosure appreciates a desire to provide an alternative approach to providing aluminum to an ion source that minimizes buildup of insulative coatings during operation of the ion source and/or enables an in-situ cleaning of such deposited coatings.

The present disclosure appreciates that aluminum-containing gases, such as dimethyl aluminum chloride (DMAC)

or trimethyl aluminum (TMA) can be provided to the ion source for implants, but may result in a deposition of aluminum-containing and/or carbon-containing deposits. In order to reduce or eliminate such deposits, the present disclosure advantageously provides chlorine-containing gases to the ion source concurrent with the provision of the aluminum-containing gases in order to mitigate the deleterious effects heretofore seen.

The present disclosure thus resolves the conventional problems associated with insulative coatings, thus allowing for stable operation of the ion implanter at high beam currents using aluminum-containing solids, liquids, and gases for ion implantation. The present disclosure further expects similar behavior with higher halogens, such as bromine (Br) and iodine (I). For example, the higher atomic mass halides of aluminum have much lower boiling points (e.g., $AlCl_3$ boiling point is approximately 180 C, $AlBr_3$ boiling point is approximately 255 C, and $AlI_3$ boiling point is approximately 360 C) compared to $AlF_3$ that has a melting point of 1291 C, with a boiling point of $AlF_3$ being significantly higher. As such, the higher halides are significantly easier to remove and pump out from the source regions, thus yielding a stable and glitch-free operation of the source that is highly desirable for an ion implanter.

The present disclosure thus provides chlorine or chlorine-containing molecules to the ion source to chemically-etch aluminum or aluminum-containing solids or liquids that are located within or outside of the ion source. Accordingly, material by-products of the etching that are subsequently formed and/or deposited on the suppression electrode and other electrodes of the ion source have a high vapor pressure at the temperatures typical of the ion source, whereby such material by-products can be swiftly evaporated. As such, electrical conductivity of electrically-active surfaces within the ion source is maintained, thus greatly reducing instabilities of the ion source. Additionally, beam currents obtained by using chlorine-based chemistries of the present disclosure are substantially comparable to those achieved with fluorine-based chemistries, without the deleterious issues associated with the fluorine-based chemistries.

The present disclosure is directed generally toward an ion implantation system and an ion source material associated therewith, as well as a method for producing ions while avoiding deleterious build-up of electrically insulative materials. More particularly, the present disclosure is directed toward components for said ion implantation system using an aluminum-containing ion source material for producing atomic ions to electrically dope silicon, silicon carbide, or other semiconductor substrates at various temperatures. Further, the present disclosure minimizes various deposits on extraction electrodes and source chamber components. The present disclosure will thus reduce associated arcing and glitching, and will further increase overall lifetimes of the ion source and associated electrodes.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, or other physical or functional units shown in the drawings or described herein could also be implemented by an indirect connection or coupling. Furthermore, it is to be appreciated that functional blocks or units shown in the drawings may be implemented as separate features in one embodiment, and may also or alternatively be fully or partially implemented in a common feature in another embodiment.

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules from an ion source of an ion implanter are ionized, accelerated, formed into an ion beam, analyzed, and swept across a wafer, or the wafer is translated through the ion beam. The dopant ions physically bombard the wafer, enter the surface and come to rest below the surface, at a depth related to their energy.

Ion sources in ion implanters typically generate the ion beam by ionizing a source material in an arc chamber, wherein a component of the source material is a desired dopant element. The desired dopant element is then extracted from the ionized source material in the form of the ion beam.

In order to gain a general understanding of the disclosure, and in accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110 to ionize a dopant gas into a plurality of ions from the ion source to form an ion beam 112. The ion beam 112 in the present example is directed through a mass analyzer 114 (e.g., a beam-steering apparatus), and out an aperture 116 towards the end station 106. The mass analyzer 114, for example, includes a field generating component, such as a magnet, and operates to provide a field across a path 117 of the ion beam 112 so as to deflect ions from the ion beam at varying trajectories according to mass (e.g., mass-to-charge ratio). Ions traveling through the magnetic field experience a force which directs individual ions of a desired mass along the path 117 and which deflects ions of undesired mass away from the path. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber. Further, a controller 130 is provided for overall control of the vacuum system 100.

The present disclosure appreciates that workpieces 118 having silicon carbide-based devices formed thereon have been found to have better thermal and electrical characteristics than silicon-based devices, in particular, in applications used in high voltage and high temperature devices, such as electric cars, etc. Ion implantation into silicon carbide, however, utilizes a different class of implant dopants than those used for silicon workpieces. In silicon carbide implants, aluminum, phosphorous, and nitrogen implants are often performed. Nitrogen implants, for example, are relatively simple, as the nitrogen can be introduced as a gas, and provides relatively easy tuning, cleanup, etc. Aluminum, however, is more difficult, as there are presently few good gaseous solutions of aluminum known.

The present disclosure contemplates that an aluminum-containing ion source material 132 (also referred to as the ion source material), for example, can be an aluminum-containing species that is provided to an arc chamber 134 of the ion source 108 for forming the ion beam 112. The ion beam 112 is extracted through an extraction aperture 140 of the arc chamber 134 via an electrical biasing of an extraction electrode 142 associated therewith. The aluminum-containing ion source material 132, for example, can be a solid source material that can be placed in a heated vaporizer assembly, whereby the resulting gas is fed into the arc chamber 134. For example, the aluminum-containing ion source material can comprise a solid high-temperature ceramic such as $Al_2O_3$ or AlN placed into the arc chamber 134 where it is to be etched or sputtered to form aluminum ions.

The present disclosure appreciates that, when etching an aluminum oxide ($Al_2O_3$) or aluminum nitride (AlN) ceramic using a fluorine-based dopant gas (e.g., $BF_3$, $NF_3$, $PF_3$, $PF_5$), the resulting by-products of the reaction (e.g., $AlF_x$, Al, N and neutrals of AlN and $Al_2O_3$) can form an insulating coating on the extraction electrode (e.g., at a negative voltage), which, in turn, can cause a deleterious charge build up and subsequent discharging to the ion source arc slit optics plate (e.g., at a positive voltage), thus further reducing the productivity of the tool.

In one example, the ion implantation system 101 of the present disclosure contemplates providing gaseous dimethylaluminum chloride ($C_4H_{10}AlCl$), also referred to as DMAC) or gaseous trimethyl aluminum (TMA) as the ion source material 132 to deliver an aluminum-containing material into the arc chamber 134 of the ion source 108 in a gaseous form. Providing DMAC or TMA to the arc chamber 134 in a gaseous form, for example, allows for faster transition times between species (e.g., less than 5 minutes), no wait times for material warm-up and cool-down, and no insulating material forming on the extraction electrode seen in conventional systems.

The aluminum-containing ion source material 132, for example, can be stored in a pressurized gas bottle when provided to the ion source 108 and/or arc chamber 134 as a gas. The aluminum-containing ion source material 132 comprising an aluminum-containing species (e.g., one of DMAC, AlN, $Al_2O_3$, and $AlC_4$), for example, is selectively provided to the arc chamber 134. For example, should the ion source material 132 be in a gaseous form, the ion source material can be flowed to the arc chamber 134 as a gas via a dedicated, primary gas line 136, as it may be highly reactive material (pyrophoric). Alternatively, the ion source material 132 can be in a solid form and positioned within or external to the arc chamber 134 or ion source 108.

One or more of a halide species and a halide molecule 144 is further introduced to the ion source 108. For example, the one or more of a halide species and a halide molecule 144 can be in a gaseous form and flowed to the ion source 108 as a gas via a dedicated secondary gas line 146. The one or more of the halide species and the halide molecule 144, for example, can be introduced to the arc chamber 134 via a gas ring 148 generally surrounding the arc chamber 134. Alternatively, the halide species and/or halide molecule 144 can be mixed with the ion source material 132 and flowed to the ion source 108 via the primary gas line 136. The halide species, for example, is selected from a group consisting of atomic chlorine, atomic bromine, and atomic iodine. The halide molecule, for example, comprises a halide selected from a group consisting of chlorine, bromine, and iodine in molecular form (e.g., $Cl_2$, $CCl_4$, $BCl_3$, $Br_2$, $I_2$, HCl, HBr, HI, $CHCl_3$, $CBr_4$, $CHBr_3$, $CH_xI_y$, etc.). The one or more of the halide species and the halide molecule 144, for example, further reacts with the ion source material 132 to form an aluminum vapor.

In another example, the present disclosure further contemplates the aluminum-containing ion source material 132 as being a constituent of one or more aluminum-containing components 150 associated with the ion source 108. For example, the one or more aluminum-containing components 150 can comprise one or more arc chamber components positioned within or proximate to the arc chamber 134 of the ion source 108, such as one or more of a cathode shield, an electrode, a repeller, a liner, a sidewall associated with the arc chamber, and a sidewall component operably coupled to the sidewall. In another example, the one or more aluminum-containing components 150 can comprise one or more gas inlet path components associated with the primary gas line 136.

Figure 2:
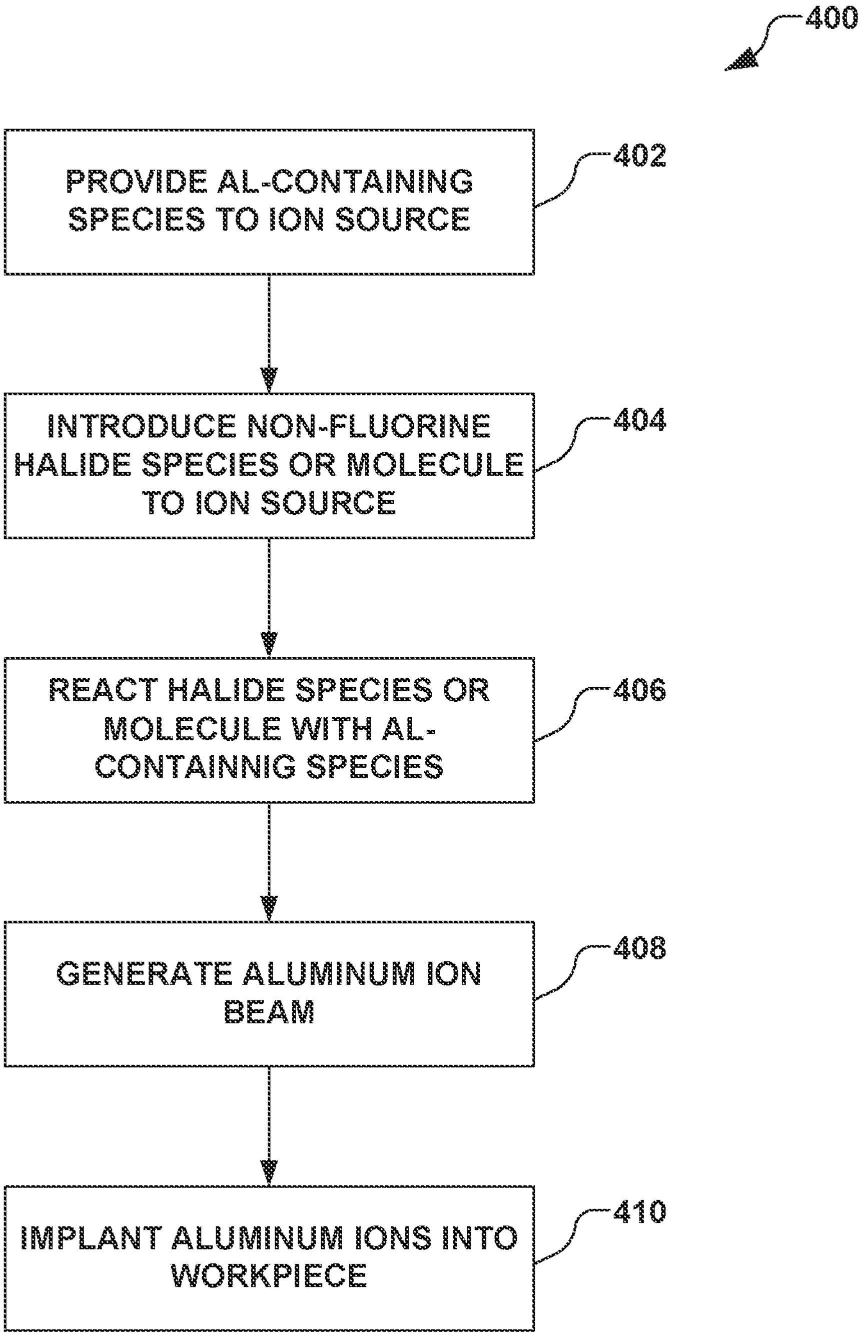
FIG. 2 illustrates an exemplary method for implanting aluminum ions into a workpiece using an aluminum-containing ion source material and a non-fluorine halide species.

FIG. 2 illustrates an exemplary method 400 for forming an aluminum ion beam is provided, whereby the aluminum ion beam can be further utilized to implant aluminum ions into a workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

In accordance with one exemplary aspect, in act 402 of FIG. 2, an aluminum-containing species is provided to an ion source. The aluminum-containing species, for example, can comprise one or more of atomic aluminum, AlN, $Al_2O_3$, and $AlC_4$. The aluminum containing species, for example, can be provided in a solid form within the arc chamber of the ion source, in a solid form in a vaporizer, whereby the solid is vaporized and fed into the arc chamber, or in a vapor form that is fed into the arc chamber.

In act 404, one or more of a halide species and a halide molecule are introduced to the ion source, wherein the halide species is selected from a group consisting of atomic chlorine, atomic bromine, and atomic iodine, and the halide molecule comprises a halide selected from a group consisting of chlorine, bromine, and iodine. The halide molecule, for example, can comprise one or more of $Cl_2$, $CCl_4$, $BCl_3$, $Br_2$, $I_2$, HCl, HBr, HI, $CHCl_3$, $CBr_4$, $ChBr_3$, $CH_xI_y$.

In accordance with one example, the one or more of the halide species or the halide molecule is introduced as a gas in a vicinity of one or more arc chamber components positioned within an arc chamber of the ion source. The one or more ion source components, for example, comprise one or more of a cathode, a repeller, and a sidewall of the arc chamber, wherein the one or more arc chamber components are heated concurrent with the generation of the aluminum ion beam. In one example, the one or more arc chamber components are heated by the generation of the aluminum ion beam. In another example, the one or more arc chamber components are heated by an auxiliary heat source, such as one or more resistive heaters.

In act 406, the one or more of the halide species and the halide molecule are reacted with the aluminum-containing species to generate an aluminum-halide vapor, wherein the ion source is generally cleaned by the one or more of the halide species and the halide molecule. For example, the one or more arc chamber components are cleaned by the one or more of the halide species and the halide molecule. In one example, the one or more of the halide species and the halide molecule can be introduced to the arc chamber via a gas ring generally surrounding the arc chamber. In another example, the one or more of the halide species and the halide molecule are directly introduced to an interior of the arc chamber. The aluminum-containing species, for example, may be held either inside the arc chamber in solid or liquid form, or outside the arc chamber, whereby the one or more of the halide species and the halide molecule pass over the material that has been heated before being fed into the arc chamber. As such, the aluminum-halide vapor is reactively generated and used for the formation of the ion beam within the arc chamber.

In act 408, an aluminum ion beam is generated from at least the aluminum-halide vapor within the arc chamber, and in act 410, aluminum ions from the aluminum ion beam can be further implanted into a workpiece.

The present disclosure thus appreciates the use of non-fluorine halides, such as chlorine-containing molecules or bromine-containing molecules, as cleaning gases for periodic in-situ preventive maintenance. For example, by introducing these cleaning gases in the vicinity of components of the ion source, the components, which may be heated from the ion formation or externally heated, are cleaned in-situ. For example, the cleaning gases could be introduced via the gas ring around the arc chamber/source housing to maintain cleanliness of the various components in the vicinity of the gas ring.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. A method for forming an aluminum ion beam, the method comprising:

providing an aluminum-containing species in a gaseous form in an ion source;

introducing one or more of a halide species and a halide molecule to the ion source, wherein the halide species is selected from a group consisting of atomic chlorine, atomic bromine, and atomic iodine, and the halide molecule comprises a halide selected from a group consisting of chlorine, bromine, and iodine;

reacting the one or more of the halide species and the halide molecule with the aluminum-containing species to generate an aluminum-halide vapor, and further etching and/or cleaning the ion source with the one or more of the halide species and the halide molecule; and generating the aluminum ion beam from at least the aluminum-halide vapor.

2. The method of claim 1, wherein the halide molecule comprises one or more of $Cl_2$, $CCl_4$, $BCl_3$, $Br_2$, $I_2$, HCl, HBr, HI, $CHCl_3$, $CBr_4$, $ChBr_3$, $CH_xI_y$.

3. The method of claim 1, wherein the aluminum-containing species comprises one or more of atomic aluminum, AlN, $Al_2O_3$, and $Al_4C_3$.

4. The method of claim 1, wherein the one or more of the halide species and the halide molecule is introduced as a gas in a vicinity of one or more arc chamber components.

5. The method of claim 4, wherein the one or more arc chamber components comprise one or more of a cathode shield, an electrode, a repeller, a sidewall associated with the arc chamber, and a sidewall component operably coupled to the sidewall.

6. The method of claim 4, wherein the one or more arc chamber components are heated concurrent with the generation of the aluminum ion beam.

7. The method of claim 6, wherein the one or more arc chamber components are heated by the generation of the aluminum ion beam and/or by an auxiliary heat source.

8. The method of claim 1, wherein the ion source comprises an arc chamber that is at least partially enclosed by an ion source housing, and wherein the one or more of the halide species and the halide molecule is introduced as a gas within the ion source housing.

9. The method of claim 8, wherein the one or more of the halide species and the halide molecule is introduced to the ion source via a gas ring at least partially surrounding the arc chamber.

10. The method of claim 8, wherein the ion source comprises an extraction electrode disposed within the ion source housing, and wherein the one or more of the halide species and the halide molecule clean a surface of the extraction electrode.

11. The method of claim 1, wherein the aluminum-containing species comprises gaseous dimethylaluminum chloride (DMAC) or trimethylaluminum (TMA).

12. The method in claim 11, wherein the gaseous DMAC or TMA is mixed with the one or more of the halide species and the halide molecule in a common gas channel prior to being provided to an ion source housing or an arc chamber plasma cavity of the ion source.

13. The method of claim 1, further comprising heating the aluminum-containing species external to the ion source prior to providing the aluminum-containing species in the ion source, wherein the one or more of the halide species and the halide molecule are introduced to an arc chamber of the ion source after passing over the aluminum-containing species, thereby defining the aluminum-halide vapor.

14. A method for forming an aluminum ion beam, the method comprising:

providing an aluminum-containing species to an ion source in a gaseous form;

introducing one or more of a halide species and a halide molecule to the ion source, wherein the halide species is selected from a group consisting of atomic chlorine, atomic bromine, and atomic iodine, and wherein the halide molecule comprises a halide selected from a group consisting of chlorine, bromine, and iodine;

reacting the one or more of the halide species and the halide molecule with the aluminum-containing species to generate an aluminum-halide vapor; and generating the aluminum ion beam from at least the aluminum-halide vapor, wherein the ion source is further at least partially cleaned by the one or more of the halide species and the halide molecule.

15. The method of claim 14, wherein the aluminum-containing species comprises gaseous dimethylaluminum chloride (DMAC) or trimethylaluminum (TMA).

16. The method in claim 15, wherein the gaseous DMAC or TMA is mixed with the one or more of the halide species and the halide molecule in a common gas channel prior to being provided to an ion source housing or an arc chamber plasma cavity of the ion source.

* * * * *